United States Patent [19]
Arnold et al.

[11] Patent Number: 4,492,913
[45] Date of Patent: Jan. 8, 1985

[54] CURRENT REGULATING CIRCUIT FOR AN ELECTRIC CONSUMER

[75] Inventors: Winfried Arnold, Vaihingen; Johannes Locher; Bernd Schelling, both of Stuttgart, all of Fed. Rep. of Germany

[73] Assignee: Robert Bosch GmbH, Stuttgart, Fed. Rep. of Germany

[21] Appl. No.: 411,713

[22] Filed: Aug. 25, 1982

[30] Foreign Application Priority Data

Sep. 10, 1981 [DE] Fed. Rep. of Germany ....... 3135805

[51] Int. Cl.³ .............................................. G05F 1/56
[52] U.S. Cl. .................................. 323/282; 123/472; 123/490; 361/152; 323/351
[58] Field of Search ................ 123/472, 490; 361/152, 361/153, 154; 323/265, 282, 349, 351

[56] References Cited

U.S. PATENT DOCUMENTS 4,360,855 11/1982 Ohba ............................... 361/153 X
4,429,339 1/1984 Jaeschke et al. ................. 361/91 X Primary Examiner—William M. Shoop
Attorney, Agent, or Firm—Edwin E. Greigg

[57] ABSTRACT

A so-called current-regulated end stage for electromagnetic consumers such as magnetic valves or electromagnetic final control elements is provided, in which a field effect transistor takes over the functions of the switch and of the current measuring resistor. When the field effect transistor is conductive, the voltage over a capacitor is made to follow the current flowing through the consumer, and when the field effect transistor is blocked, the flow of current through the free-running circuit is simulated via the capacitor discharge. Both a singlefold and a multiple realization are disclosed, the latter using multiple examples of an RC member and a threshold switch.

16 Claims, 6 Drawing Figures

CURRENT REGULATING CIRCUIT FOR AN ELECTRIC CONSUMER

BACKGROUND OF THE INVENTION

The invention relates generally to electronic control circuits for electric consumers and, in particular, to a current regulating circuit for an electromagnetic consumer of a motor vehicle control unit.

Internal combustion engines with externally supplied ignition are increasingly being equipped with intermittently functioning injection systems. The fuel metering is effected by means of controlled opening times of electromagnetically actuated injection valves. This can be attained by means of high switching currents, among other provisions, at least at the instant the magnetic valve switches on. For reasons having to do with power loss, it has long been known to send a high current through the magnetic coil at the beginning of the opening period of an electromagnetic injection valve, and then to reduce this current down to the so-called maintenance current, until at the end of the injection pulse the maintenance current is switched off as well. Now in order to be able to set the lowest possible maintenance current, regulation of this current is necessary. This purpose is served by a current measuring resistor in series with the exciter winding of the magnetic magnetic valve and by a current control device (as a rule, in the form of a transistor), and the current through the magnetic winding can then be set to a specialized value via the voltage drop at the measuring resistor. Thus in the known electrical circuit layout, three components are located between the two battery voltage terminals: the magnetic winding of the injection valve, the current control device, and the measuring resistor. Particularly with a view to simple systems, the measuring resistor is not desirable, because as a rule it must be designed for high outputs at a low resistance value and thus is of no small importance in calculating the cost of the circuit layout.

OBJECT AND SUMMARY OF THE INVENTION

In the regulating circuit according to the invention, current is supplied to an electric consumer through a field effect transistor switch which is closed by a comparator whenever the voltage across a capacitor is less than a low threshold value and is opened by the comparator whenever the capacitor voltage rises to a high threshold value. Whenever the FET switch is closed, the capacitor is connected across the FET switch, whereby the FET switch serves as a current measuring resistor to charge the capacitor as a function of the current flowing through the consumer and the FET switch. Whenever the FET switch is opened, the capacitor is connected across a discharge resistor having a value such that the voltage across the capacitor simulates the current flow through the consumer. Thus the average consumer current is regulated by switching the FET switch in accordance with a measured maximum consumer current and a simulated minimum consumer current. When the consumer is an electromagnetically actuated device, the comparator may include a threshold adjusting circuit for raising the high threshold value by a predetermined increment during an initial switching operation closing the FET switch.

With the circuit layout according to the invention, the expenditure previously required for measuring resistors can be spared, without having to accept any loss of quality. Particularly in view of the heat development caused by the unavoidable power loss, this is an advantage which should not be underestimated, which becomes important particularly if it is desired that the individual components be capable of being packaged very compactly.

The invention will be better understood and further objects and advantages thereof will become more apparent from the ensuing detailed description of preferred embodiments taken in conjunction with the drawings.

DESCRIPTION OF THE EXEMPLARY EMBODIMENTS

The exemplary embodiments relate to signal output stages in electromagnetically controlled injection systems in internal combustion engines having externally supplied ignition. Such output stages are also known as "current-regulated end stages".

Figure 1:
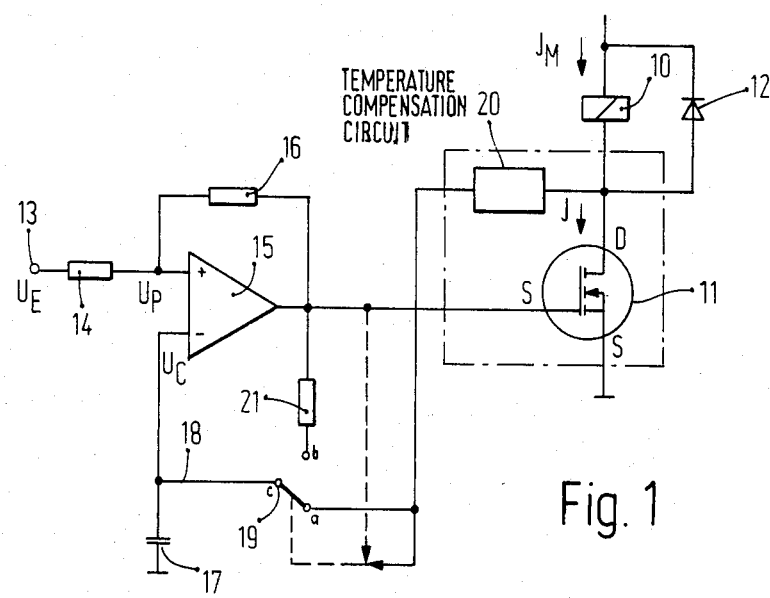
FIG. 1 is a basic schematic diagram of a triggering unit for an electromagnetic injection valve having the circuit layout according to the invention.

In FIG. 1, reference numeral 10 designates the magnetic winding of an electromagnetic injection valve, and a field effect transistor (FET) 11 is switched in series with it. This series circuit is located between two battery terminals, not shown further. Parallel to the magnetic winding 10, there is also a free-running diode 12. From an input terminal 13, a resistor 14 leads to the positive input of an operational amplifier 15, which on the output side is coupled with the gate terminal of the field effect transistor 11. The operational amplifier 15 has positive feedback via a resistor 16. From its negative input, a capacitor 17 leads to ground and a line 18 also leads to an alternating switch 19. In the illustrated position of the alternating switch 19, the capacitor 17 is located parallel to the drain-source path of the field effect transistor 11. In this connecting line, in the immediate vicinity of the FET, a temperature compensation circuit 20 is provided. In the other switching position of the alternating switch 19, a resistor 21 enables a clearly defined negative feedback of the operational amplifier 15. Dashed lines in connection with the switch 19 indicate that this switch can be switched either with the drain signal of the FET 11 or with the output signal of the operational amplifier 15.

Figure 2A:
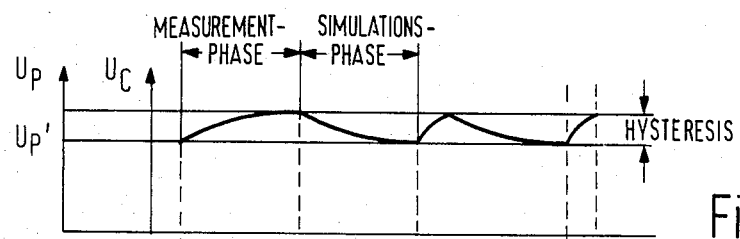
FIGS. 2a and 2b are voltage-time diagrams explaining the circuit layout shown in FIG. 1.
Figure 2B:
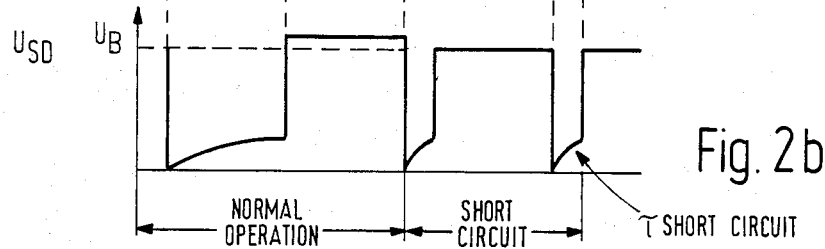

The subject shown in FIG. 1 will now be explained with the aid of the diagrams of FIG. 2. There, diagram 2a shows the voltage across the capacitor 17 and diagram 2b shows the voltage drop across the drain-source of the FET 11.

What is important is that the flow of current through the magnetic winding 10 of the injection valve be clocked during an injection pulse. The FET located in series with the magnetic winding thus becomes intermittently conductive within the pulse duration of one injection pulse or is directed into its blocked state. During its conductive phase, this FET may now be considered as a current measuring resistor. Since during its blocked phase no current flows through it and thus there is also no voltage drop via this transistor, in these moments it shuts off the magnetic current, acting as a current measuring resistor, and an auxiliary variable must be formed for this magnetic valve current. For this reason, a simulation of the current course through the magnetic winding 10 during the blocked phase of the FET 11 takes place, being effected by means of an RC member. During the conductive state of the FET 11, the capacitor 17 is charged for this purpose and is then discharged again during the subsequent blocked phase. This is effected via the resistor 21. In FIG. 2 this continuous charging and discharging of the capacitor 17 as shown, with the resulting hysteresis depending on the values of the individual resistors in combination with the operational amplifier 15. The current flow phase through the FET 11 corresponds to the part of the signal having a rising voltage course, and the simulation phase corresponds to that with a negative course. The circuit layout shown in principle in FIG. 1 thus, as shown in FIG. 2, enables clocking of the switching transistor during one injection pulse in accordance with an attained maximum value of the current and a simulated minimum value.

In consideration of the increased power requirement at the beginning of an opening phase of the injection pulse, for the sake of keeping the total power loss as low as possible it is desirable to realize this increased power requirement by means of an initially increased current flow through the magnetic valve. Subsequently then, for the remaining duration of the injection pulse, the average energy is reduced, and it then needs to be only great enough that the injection valve can be kept in its open position. One possibility of realization for this power course with a circuit layout according to the invention is shown in detail in FIG. 3. The individual elements, so far as they agree with those of FIG. 1, are identified by the same reference numerals.

Figure 3:
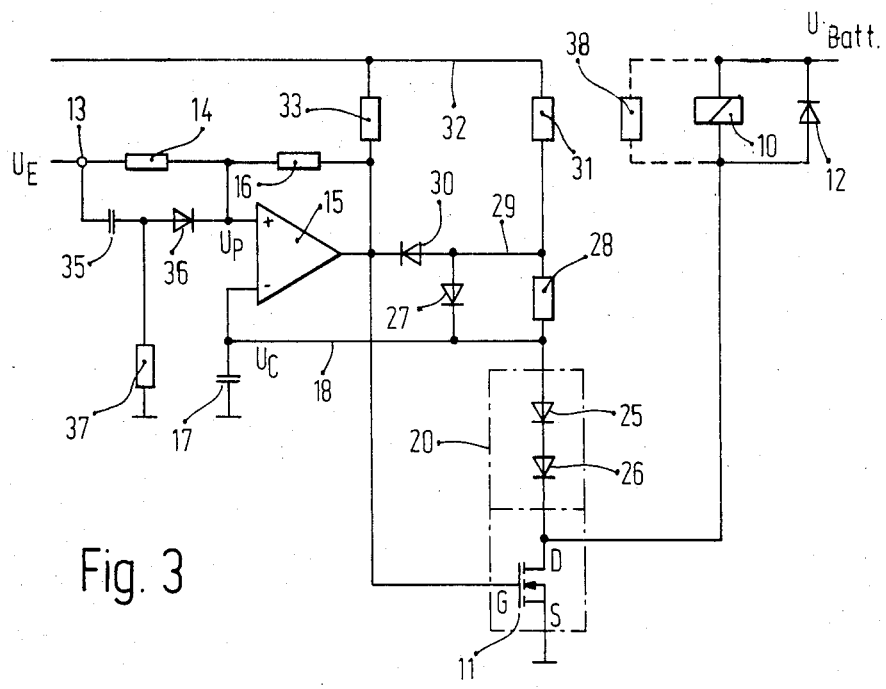
FIGS. 3, 4 and 5 are schematic diagrams showing modifications of the circuit layout of FIG. 1.

In the subject of FIG. 3, the switch 19 of FIG. 1 is realized by means of a diode combination. In the subject of FIG. 3, the line 18 is connected via two diodes 25 and 26 with the drain terminal of the FET 11 and also via a parallel circuit of the diode 27 and resistor 28 with a connecting line 29, which is coupled first with the output of the operational amplifier 15 via a diode 30 and, second, with a positive line 32 via a resistor 31. The output of the operational amplifier 15 is additionally connected via a resistor 33 with a positive line 32.

In order to realize the initial excessive increase in current, so that sufficient attracting current is made available for the magnetic winding 10, there is an RC member parallel to the resistor 14. It is made up of a series circuit of the capacitor 35 and the diode 36, and the connecting point of these two components is connected to ground via a resistor 37. Finally, a resistor 38 is shown in broken lines parallel to the magnetic winding, representing the ohmic resistance of the magnetic winding 10.

In detail, the circuit layout of FIG. 3 functions as follows:

If the potential at the input terminal 13 jumps to a positive value, then the operational amplifier 15 switches through; its output value also moves upward and switches the FET 11 into its conductive state.

When the FET 11 is conductive, the voltage drop across its channel resistors is proportional to the current through the magnetic winding 10. The diodes 25 and 26 are prestressed at low resistance via the resistor 31 and the diode 27. This means that at the anode of the diode 25, the drain-source voltage is increased by twice the voltage passed through the two diodes 25 and 26, and the capacitor 17 follows this voltage. This corresponds with the measurement phase described in connection with FIGS. 1 and 2. When the voltage across the capacitor 17 reaches the switching threshold of the operational amplifier 15 switched as a comparator, then the output value of the operational amplifier 15 changes to a low potential. As a result, the FET 11 is blocked and the current through the magnetic winding drops exponentially via the free-running diode 12. At the same time, the two diodes 25 and 26 are reverse-biased and rendered nonconductive. The original threshold value voltage $U_p$ is switched to a lower level $U_{p2}$ by means of the two resistors 14 and 16, and the hysteresis shown in FIG. 2 results. The capacitor 17 can now discharge via the resistor 28 and the diode 30 as well as the output of the operational amplifier 15. With the resistance value of a resistor 28, the discharge time can thus be varied and thus adapted to the course of current through the magnetic winding 10 (simulation phase).

If the capacitor voltage attains the threshold $U_{p2}$, then the operational amplifier 15 again switches through, and the next current flow phase of the FET 11 follows.

The initial attracting current, which is at a level higher than the subsequent maintenance current, is realized by means of the high-pass filter with the capacitor 35 and the resistor 37. With this filter, the initial threshold of the operational amplifier 15 is increased in accordance with the selected dimensions.

In the case of short-circuiting, the resistor 38 parallel to the magnetic winding 10 comes into action. Its relatively low resistance value causes a rapid increase in the voltage over the capacitor 17, so that the threshold voltage of the operational amplifier is attained within a short time, resulting in switch-on pulses of very short duration at the FET 11. The next switch-on pulse comes only after the voltage over the capacitor 17 has again dropped in accordance with the simulation phase for the correctly connected magnetic valve. As a result, the average power loss in the FET is reduced, even in the event of short circuiting, to a minimum value.

TEMPERATURE COMPENSATION

MOS transistors, and in particular Sip-MOS transistors, have a clearly defined resistance value in the conductive state, which has very little variation from one individual transistor to another. The temperature coefficient is positive. By means of the thermal coupling of the diodes 25 and 26 whose temperature coefficient is negative, a temperature compensation is attained and thus a course of the signal over the capacitor 17 which is not dependent on temperature. If the two diodes 25 and 26 are integrated on the MOS chip, possibly together with the circuit as a whole, then this combination would be optimal. Under some circumstances, even one diode would be sufficient.

Compensation for the temperature behavior of the FET 11 may be omitted if only the short circuit of the magnetic valve 10 is to be recognized or if the trigger voltage compensates for drift by means of a superimposed regulating circuit.

Figure 4:
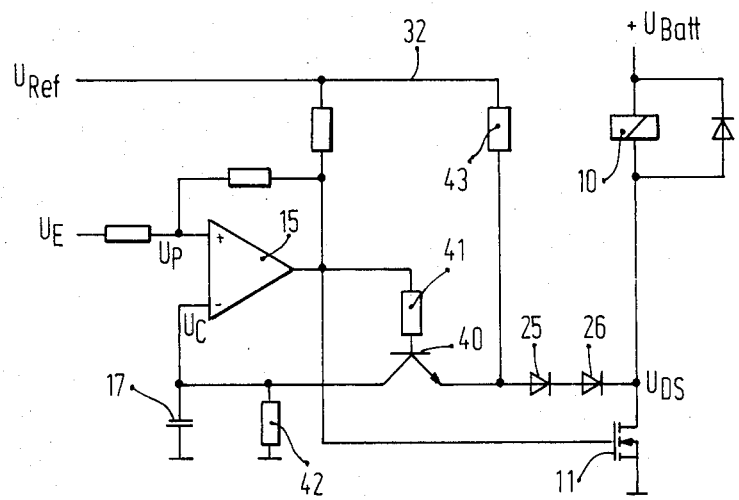

FIG. 4 shows a circuit which differs from that of FIG. 3 in that the collector-emitter path of a transistor 40 is located between the capacitor 17 and the diodes 25 and 26. The base of this transistor 40 is connected via a resistor 41 with the output of the operational amplifier 15. Parallel to the capacitor 17, there is a resistor 42 which determines the discharging of the capacitor 17. The emitter of the transistor 40 is connected via a resistor 43 with the positive line 32.

In principle, the circuit shown in FIG. 4 corresponds to those of FIGS. 1 and 3. The difference is solely the realization of the switch 19 of FIG. 1, and during the discharge phase of the capacitor 17 a parallel resistor 42 additionally comes into effect.

Figure 5:
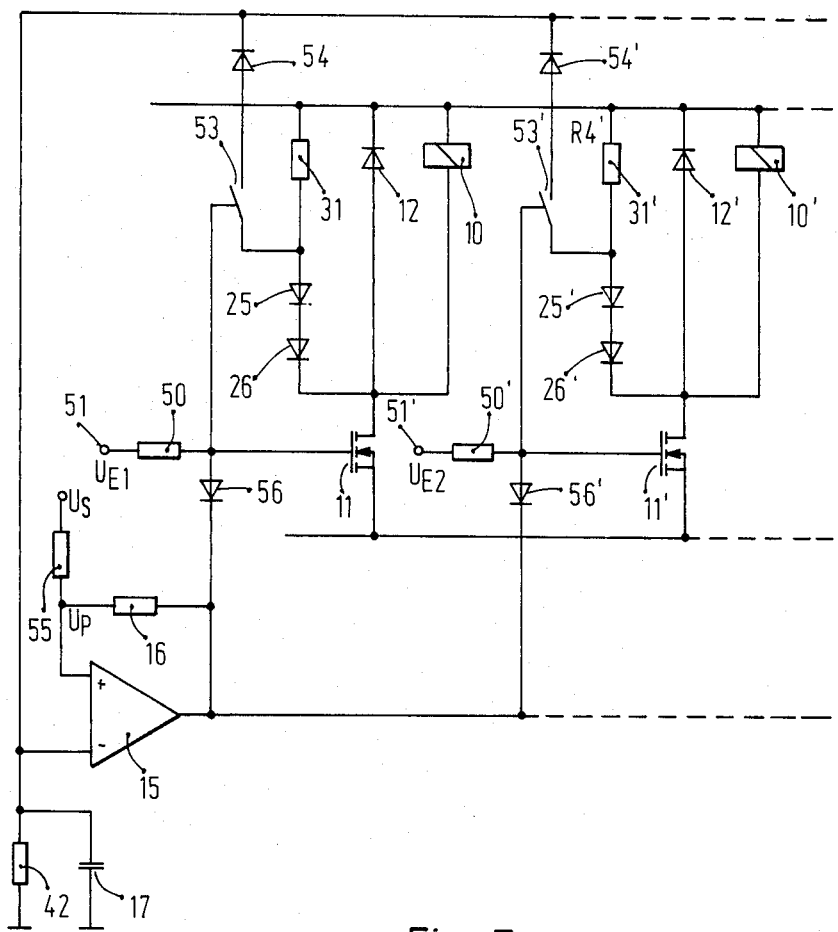

FIG. 5 shows a multiple arrangement of controlled electromagnetic valves. The FET 11 is supplied with a switching signal from a connection terminal 51 via a specialized resistor 50, this signal representing the total duration of the injection pulse. The remaining circuitry serves to clock the FET over the entire duration of the injection pulse and thus to throttle the flow of current through the magnetic winding 10. The operational amplifier with a capacitor 17 and a parallel resistor 42 can again be seen. The magnetic winding 10 has a series circuit parallel to it comprising the two diodes 25 and 26 as well as the resistor 31. From the connecting point of the diode 25 and the resistor 31, a switch 53 and a diode 54 lead to the negative input of the operational amplifier 15, to which the RC member 17, 42 is connected as well. The positive input of the operational amplifier 15 receives a threshold control signal via a resistor 55 and on the output side it is coupled via a diode 56 with the gate terminal of the FET 11. The switch 53 is likewise triggered by the gate signal. What is important in the subject of FIG. 5 is that the portion encompassing the components 10, 11, 12, 25, 26, 31 and 50-56 has been doubled in this realization and can also be further expanded as desired; the individual injection valves having the magnetic valves 10 and 10' are controllable separately from one another via the respective connection terminals 51 and 51'. In the event that the switching signals for the magnetic windings 10 and 10' do not overlap, then a single measurement simulation unit suffices, this unit including the RC member 17, 42 and the operational amplifier 15.

The circuit layouts described above have proved to be advantageous in that they require no separate measuring resistor for the current through the magnetic winding and are thus favorable in cost. A further advantage is the low power loss in the control unit, which is based on the simplicity of the layout, as well as the relatively simple means of temperature compensation, particularly given complete integration of the circuit layout. Furthermore, the circuit layouts have proved to be short-circuit-proof.

Although the invention has been described above in connection with an injection system in an internal combustion engine, this should not be considered a restriction of the invention. The invention can be used anywhere where inductive consumers are supposed to function quickly and reliably, while the expense for components is simultaneously low. Particularly appropriate in addition are electromagnetic adjusting elements for diesel injection systems which operate with a pulse-length-modulated continuous signal. It has also been found that the circuit layout can be used in ohmic and capacitive consumers, if the power inductances and capacitances come into effect with pulsed high-frequency signals and the circuit layout serves as a means of protecting against short-circuiting.

The foregoing relates to preferred exemplary embodiments of the invention, it being understood that other embodiments and variants thereof are possible within the spirit and scope of the invention, the latter being defined by the appended claims.

What is claimed and desired to be secured by Letters Patent of the United States is:

1. In an electrical circuit in combination with a motor vehicle control unit having an electrical consumer and a switch means for supplying current to the consumer, the improvement which comprises:
   current regulating means for regulating the consumer current;
   a field effect transistor (FET) which is connected in the circuit to serve as said switching means and to also serve as a current measuring device for said current regulating means; and
   the field effect transistor having a current measuring pick-up means connected thereto.

2. A circuit as defined in claim 1, wherein the electric consumer is an inductive consumer.

3. A circuit as defined by claim 1, wherein a fuel metering device is provided as the consumer.

4. A circuit as defined by claim 3, wherein the fuel metering device is a magnetic valve.

5. A circuit as defined by claim 1, wherein the current regulating means comprises:
   measuring means, including an RC member, for measuring the course of current in the consumer; and
   simulating means, also including said RC member, for simulating the course of current in the consumer.

6. A circuit as defined by claim 4, wherein:
   the current regulating means includes a FET control means for switching the FET between a conductive state or current flow phase; and a nonconductive state or blocked phase; and
   the RC member includes a capacitor which is charged by said measuring means during the current flow phase of the FET and is discharged by said simulating means during the blocked phase of the FET.

7. A circuit as defined in claim 6 wherein the FET control means comprises an operational amplifier switched as a comparator in accordance with the signal over the capacitor.

8. A circuit as defined by claim 7, characterized in that a first switch-on threshold of the current through the FET is at a higher level than a subsequent switch-on threshold.

9. A circuit as defined by claim 7, which further comprises at least one additional electric consumer and a like number of additional field effect transistors for respectively supplying current to the additional consumers, the additional field effect transistors being controlled by said operational amplifier and RC member of said current regulating means.

10. A circuit as defined by claim 2, wherein the fuel metering device is a final control element for the quantity-determining member of a diesel injection system.

11. A circuit as defined by claim 1, wherein a magnetic valve for hydraulic systems is provided as the consumer.

12. A circuit for regulating current supplied to an inductive consumer from a direct current source, which comprises:
   a free-running diode connected in parallel with the consumer;
   a field effect transistor, or FET, having a source-drain path connected in series with the consumer and having a gate terminal for receiving a FET control signal which controls the conductivity of the FET source-drain path;

FET control means for generating and switching the FET control signal between a first value at which the FET source-drain path is rendered conductive and a second value at which the FET source-drain path is rendered nonconductive in accordance with a signal corresponding to current flowing in the consumer, the FET control means switching the FET control signal to its first value whenever the value of the signal corresponding to the consumer current is less than a predetermined low threshold value, and the FET control means switching the FET control signal to its second value whenever the signal corresponding to the consumer current rises above a predetermined high threshold value; and signal generating means for generating the signal corresponding to the consumer current, which comprises:

a capacitor, a capacitor charging circuit including the FET source-drain path, a capacitor discharging circuit including a discharge resistor, and a capacitor switching means, controlled at least indirectly by the FET control means, for switching the capacitor between the charging circuit and the discharging circuit, the capacitor switching means switching the capacitor into the charging circuit in parallel arrangement to the FET source-drain path whenever the FET source-drain path is rendered conductive by the FET control means wherein the voltage across the capacitor increases as the consumer current increases and is a measure of the consumer current, and the capacitor switching means switching the capacitor into the capacitor discharging circuit whenever the FET source-drain path is rendered nonconductive by the FET control means wherein the discharge resistor through which the capacitor discharges has a resistance valve such that the voltage across the capacitor when it is being discharged simulates the consumer current, wherein the voltage across the capacitor constitutes the signal corresponding to the consumer current for controlling the FET control means.

13. A circuit, as described in claim 12, wherein the capacitor switching means is controlled in accordance with the FET control signal.

14. A circuit, as described in claim 12, wherein the capacitor switching means is controlled in accordance with the voltage across the FET source-drain path.

15. A circuit, as described in claim 12, wherein the FET control means further comprises threshold adjusting means for raising the high threshold value by a predetermined increment during an initial switching operation of the FET control means rendering the FET source-drain path conductive.

16. A circuit, as described in claim 12, wherein the FET control means comprises an operational amplifier connected as a comparator with hysteresis.

* * * * *